(12) United States Patent
Lew et al.

(10) Patent No.: US 8,354,860 B1
(45) Date of Patent: Jan. 15, 2013

(54) TAILBITER FOR RF PULSED LOAD

(75) Inventors: Wilbur Lew, Mount Laurel, NJ (US);
Uditha D. Jayakody, Mount Laurel, NJ (US); Jeffrey L. Vanduyne, Cinnaminson, NJ (US)

(73) Assignee: Lockheed Martin Corporation, Bethesda, MD (US)

( * ) Notice: Subject to any disclaimer, the term of this patent is extended or adjusted under 35 U.S.C. 154(b) by 0 days.

(21) Appl. No.: 12/977,354

(22) Filed: Dec. 23, 2010

(51) Int. Cl.
*H03K 19/0175* (2006.01)
(52) U.S. Cl. ............. 326/83; 326/27; 327/108; 327/112
(58) Field of Classification Search ............... 326/17–34, 326/56, 58, 82–92
See application file for complete search history.

(56) References Cited

U.S. PATENT DOCUMENTS

| | | | | |
|---|---|---|---|---|
| 6,307,409 | B1 * | 10/2001 | Wrathall | 327/112 |
| 7,508,267 | B1 * | 3/2009 | Yu et al. | 330/286 |
| 7,596,006 | B1 | 9/2009 | Granat | |
| 7,656,141 | B1 | 2/2010 | Granat | |
| 7,969,128 | B2 | 6/2011 | Granat | |
| 2008/0088283 | A1 * | 4/2008 | Ruobiao et al. | 323/271 |

* cited by examiner

*Primary Examiner* — Shawki Ismail
*Assistant Examiner* — Jany Tran
(74) *Attorney, Agent, or Firm* — Howard IP Law Group, PC

(57) ABSTRACT

A power gating circuit responds to a power enable signal to apply and withhold power to a MMIC. The gating circuit includes an OR gate and an AND gate, each coupled to the gate of a FET for controlling its conduction. One of the two FETs sources current to a load, and the other discharges the load. The gates are coupled so that the sourcing and discharge FETS are never turned ON simultaneously.

22 Claims, 3 Drawing Sheets

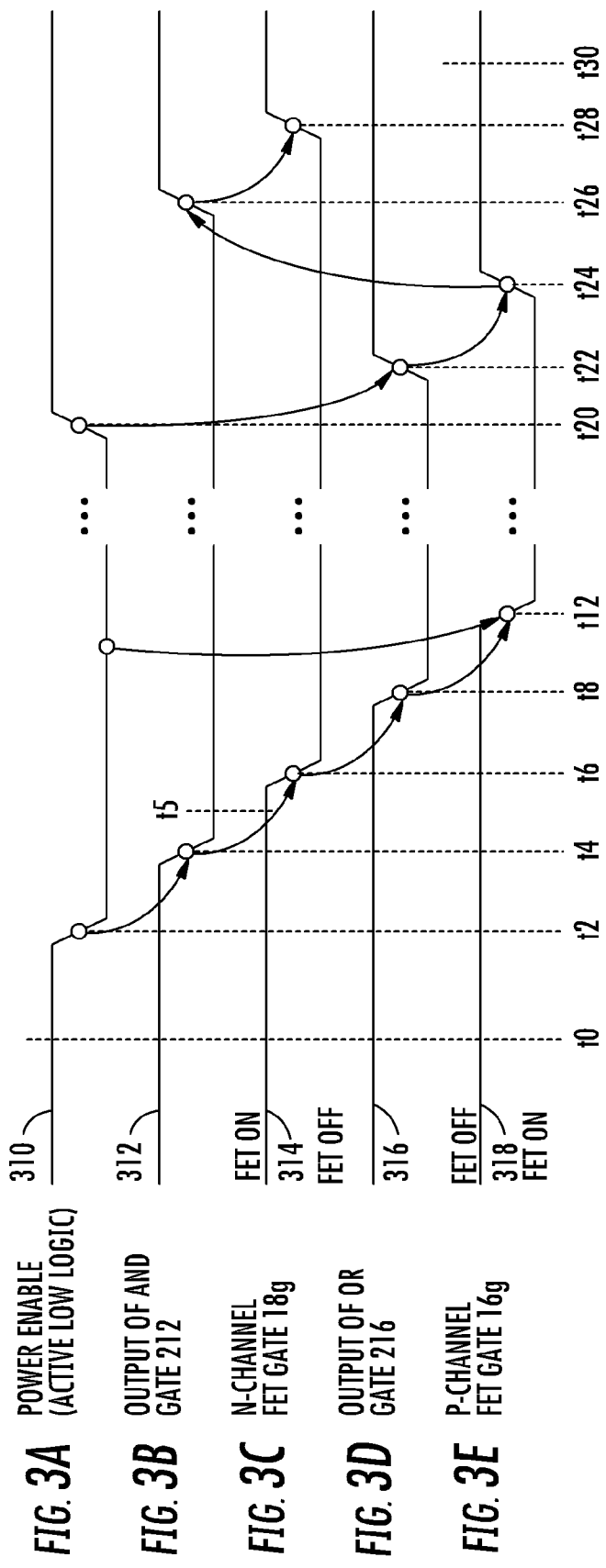

TAILBITER FOR RF PULSED LOAD

BACKGROUND

High power pulsed devices are of great importance in various fields. Among the users of high power pulses are radar system transmitters and RF illuminators. For Radar, the control of the leading and lagging edges of the pulses is critical for detection of close in targets. If the pulses are not sharp-edged, it is difficult to determine the turn-ON or turn-OFF moments that result in larger dead time between transmit and receive pulse. It is the dead time between transmit and receive that determine the close in range limitation for a pulse radar.

A major problem with pulsed power circuits is that they typically use open-drain devices which have an unbalanced turn-ON/turn-off time, where turn-OFF is typically much slower then turn-ON. As such, radar dead time is driven by the slower rate.

It is ordinarily assumed that an open-drain power circuit device ceases to operate once DC and input RF power is removed. However, in many solid state RF amplifiers, energy is stored within local capacitor and transistor electric fields. This energy, which has not been discharged through the power line, can result in undesired in-band and/or out-of-band RF radiation.

SUMMARY

A gating circuit according to an aspect of the disclosure is for responding to active low pulse signals which command a pulse to occur, and for driving a highline P-channel FET and a lowline N-channel FET. The gating circuit comprises a two-element FET gate driver in which one element drives the highline P-channel FET and the other element drives the low line N-channel FET, and in which an output of each element connects to a pair of scaling resistors which provide inputs to two logic gates, which logic gates also receive the active low pulse signals. The gating circuit further comprises inputs to the gate driver from outputs of the logic gates.

A gating circuit is for driving a load, and comprises a power bus connected to the load for maintaining a direct voltage. A first load driver is connected to the power bus and to the load. A second load driver is connected to the power bus and to the load. The gating circuit also includes a first logic gate capable of receiving a power enable signal. The first logic gate is connected to the first load driver. The gating circuit also includes a second logic gate capable of receiving the power enable signal. The second logic gate is connected to the second load driver. A first feedback path extends from an output of the first logic gate to an input of the second logic gate. A second feedback path extends from an output of the second logic gate to an input of the first logic gate. In a particular embodiment, the load may include first and second terminals, the power bus may include first and second conductors across which the direct voltage is maintained, and a connection may be provided between the second terminal of the load and the second conductor of the power bus. In a further embodiment, the first load driver includes source, gate, and drain electrodes, the source electrode of the first load driver is connected to the first power bus conductor, and the drain electrode of the first load driver is connected by a first output path to the first terminal of the load. In a further embodiment of the gating circuit (10), the second load driver includes source, gate, and drain electrodes, with the source electrode of the second load driver being connected to the second power conductor and the drain electrode of the second load driver being coupled by a second output path to the first terminal of the load. In a further embodiment, the first logic gate may comprise an OR gate including first and second input terminals and an output terminal. The first input terminal of the OR gate is connected to receive the power enable signal and the output terminal of the OR gate is coupled by a first intermediate path to the gate of the first load driver. The second logic gate may comprise an AND gate including first and second input terminals and an output terminal. The first input terminal of the AND gate is connected to receive the power enable signal, and the output terminal of the AND gate is coupled by a second intermediate path to the gate of the second load driver. The first feedback path extends from the output terminal of the OR gate to the second input terminal of the AND gate, and the second feedback path extends from the output terminal of the AND gate to the second input terminal of the OR gate.

A gating circuit according to an aspect of the disclosure is for driving a load, which load includes first and second terminals. The load may comprise a drain of a monolithic microwave integrated circuit. The gating circuit comprises a power bus including first and second conductors across which direct voltage is maintained, and a connection between the second terminal of the load and the second conductor of the power bus. A first load driver includes source, gate, and drain electrodes. The first load driver may comprise a p-channel enhancement-mode FET. The source electrode of the first load driver is connected to the first power bus conductor, and the drain electrode of the first load driver is connected by a first output path to the first terminal of the load. The gating circuit includes a second load driver including source, gate, and drain electrodes. The second load driver may comprise an N-channel enhancement-mode FET. The source electrode of the second load driver is connected to the second power conductor and the drain electrode is coupled by a second output path to the first terminal of the load. A source of power enable signal takes on a first logic state when the load is to be disabled and a second logic state when the load is to be enabled. An OR gate is provided, which OR gate includes first and second input terminals and an output terminal. The first input terminal of the OR gate is connected to receive the power enable signal, and the output terminal of the OR gate is coupled by a first intermediate path to the gate of the first load driver. An AND gate includes first and second input terminals and an output terminal. The first input terminal of the AND gate is connected to receive the power enable signal, and the output terminal of the AND gate is coupled by a second intermediate path to the gate of the second load driver. A first feedback path extends from the output terminal of the OR gate to the second input terminal of the AND gate. A second feedback path extends from the output terminal of the AND gate to the second input terminal of the OR gate. The first intermediate path andor the second intermediate path may include a current limiting resistor. The first andor second feedback paths may include a voltage divider. The gating circuit may comprise a capacitor connected between the first and second conductors of the power bus. The second output path may comprise a resistor.

A power gating circuit responds to a power enable signal to apply and withhold power to a MMIC. The gating circuit includes an OR gate and an AND gate, each coupled to the gate of a FET for controlling its conduction. One of the two FETs sources current to a load, and the other discharges the load. The gates are coupled so that the sourcing and discharge FETS are never turned ON simultaneously.

BRIEF DESCRIPTION OF THE DRAWINGS

FIGS. 3A, 3B, 3C, 3D, and 3E are amplitude-versus-time plots of various waveforms associated with the power supply of FIG. 1.

DETAILED DESCRIPTION

A power switch circuit, which both supplies and grounds the DC power line into the load in accordance with an aspect of the disclosure, improves turn-ON/turn-OFF times and reduces unwanted RF emissions. The load may include the drain of a Monolithic Microwave Integrated Circuit (MMIC). By both sinking and sourcing current into the load at specific times, control edges can be established. By skewing the time between sourcing and sinking current, shoot-through is prevented, and the control edges are established without major impact to total system power. The sourcing of current is provided by a solid state switch connected to the power supply bus, while the sinking of load is provided by a solid state switch connected to ground or load return.

When the input control signal is set, the solid state switch connected to the power bus is turned ON, the switch connected to ground is turned OFF, and current is sourced to the load. When the input control signal is reset the solid state switch connected to the power bus is turned OFF, the switch connected to ground is turned ON, and the load is shorted. It is this shorting of the load that reduces unwanted RF emissions. Control of the sourcing and sinking switch is performed by a gating circuit that determines the sequence for switch closures. This gating circuit monitors key feedback control points to insure the two switches are never both on, thus preventing the power bus from being shorted to ground. Since control of the gating circuit is performed with combinational logic, and is not clock dependent, switching occurs in nanoseconds. Additionally, the power consumed by the gating circuit is low relative to the power consumed by the load so the additional circuitry does not have a major cost or system impact. By incorporation of this gating circuit into modern pulse radar, dead times of nanoseconds can be achieved, thereby enabling tracking of high speed close in targets.

Figure 1:
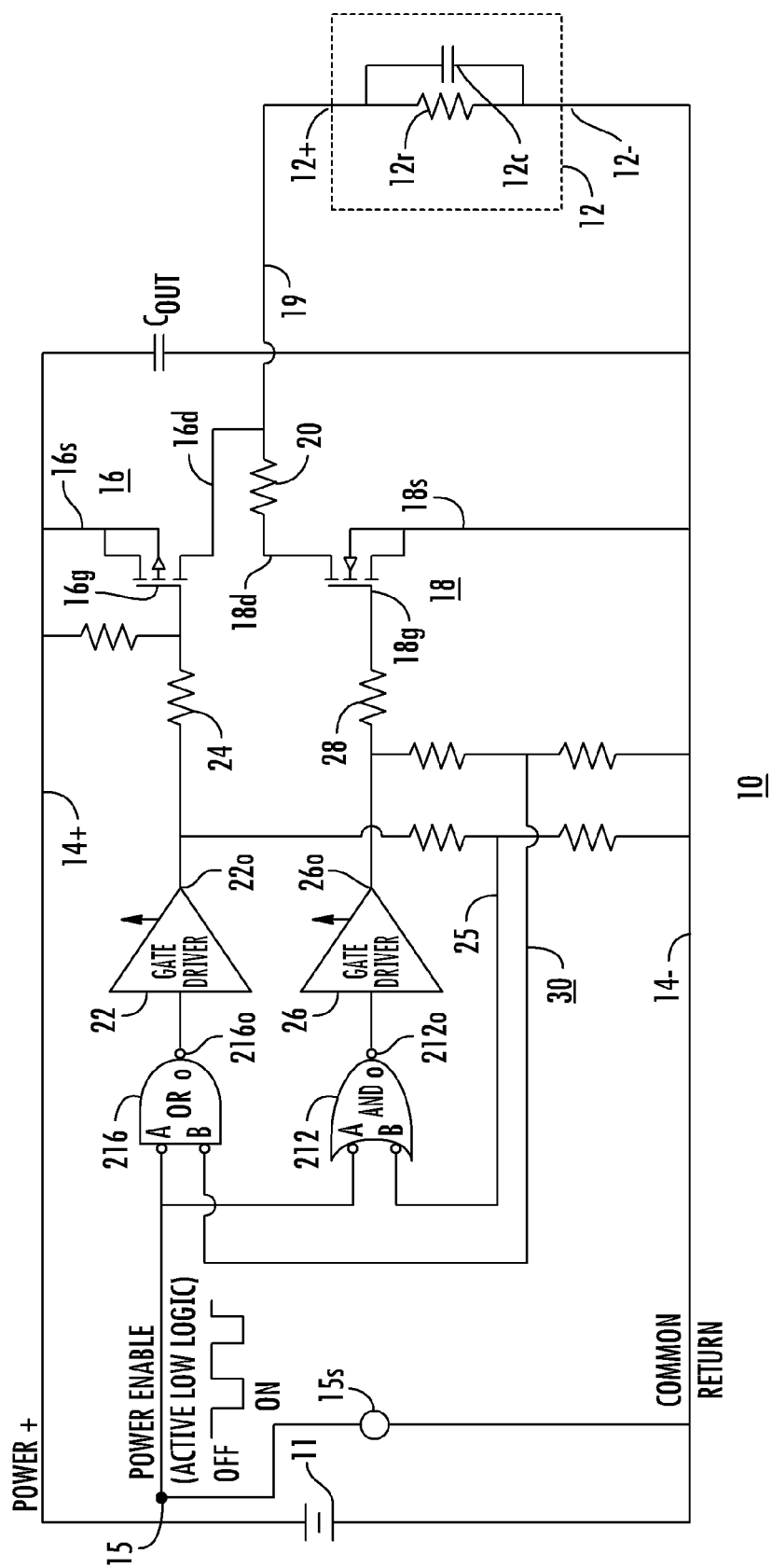
FIG. 1 is a simplified schematic representation of a pulse power supply for a pulsed load.

In FIG. 1, a pulsed power supply 10 is energized from a direct voltage source illustrated as a battery 11 and powers a load 12. Load 12 is illustrated as including a resistive component 12$r$ and a capacitive component 12$c$. In this particular embodiment, a positive (+) power bus 14+ and a negative power bus 14− convey, the direct voltage from source 11 to power supply 10. A capacitor $C_{out}$ connected to buses 14+ and 14− supplies current surges required by the supply 10 and damps ringing. The state of power supply 10 is commanded by power enable pulse signals applied from a source (not illustrated) to a command input port 15. In this particular embodiment, the power enable pulse represents an ON command by a logic low level, and an OFF command by a logic high level, which may be viewed as being negative logic.

The load 12 in one embodiment of the disclosure is the drain of a power FET, and more particularly a drain of a Monolithic Microwave Integrated Circuit (MMIC).

In FIG. 1, a controllable power P-channel, enhancement-mode FET 16 includes source, drain and gate terminals or electrodes 16$s$, 16$d$, and 16$g$, respectively. Source 16$s$ is connected to bus 14+, and drain 16$d$ is connected to the positive (+) end of load 12. Power is supplied to load 12 from bus 14+ when FET 16 is in the ON state by way of a channel extending between drain 16$d$ and source 16$s$. Thus, when FET 16 is ON, power in the form of current flows from bus 14+, by way of the channel of the FET to conductor 19 and load 12. Those skilled in the art know that the current flow also extends through load 12 and into return bus 14−. The instantaneous charge required for the energization of the load is at least partially provided by capacitor $C_{out}$. A controllable power N-channel enhancement-mode FET 18 includes source 18$s$, drain 18$d$, and gate 18$g$ terminals or electrodes. When load 12 is to be de-energized, FET 16 is rendered nonconductive or OFF, following which FET 18 is rendered conductive or ON. When FET 18 is turned ON, residual or remanent charge on the load is discharged by way of a path including path 19, a resistor 20, and the channel of FET 18. Resistor 20 is a small value selected to limit the current flow through FET 18 to a safe (nondestructive) value when FET 18 turns ON.

Figure 2A:
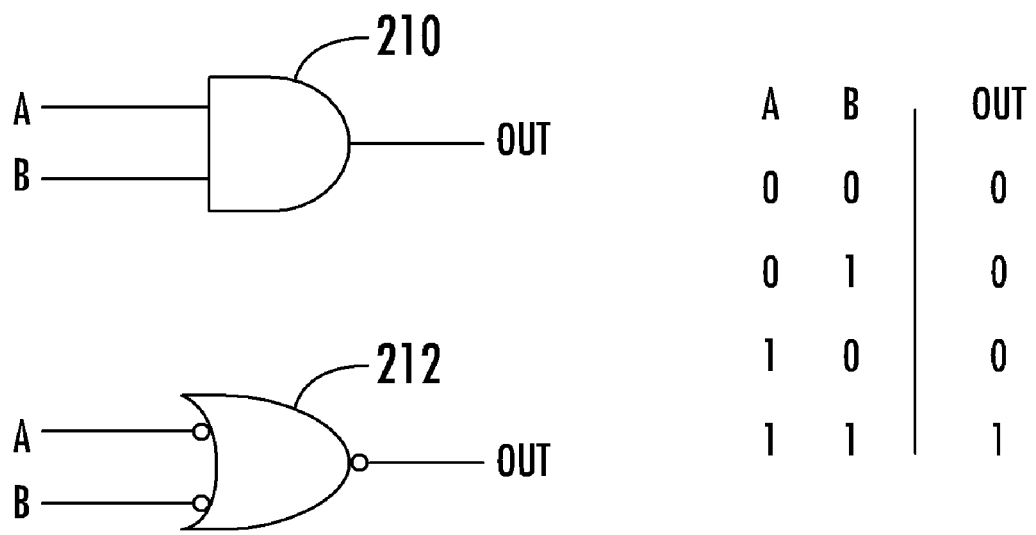
FIG. 2A illustrates two equivalent AND gates in symbolic form together with their truth table.
Figure 2B:
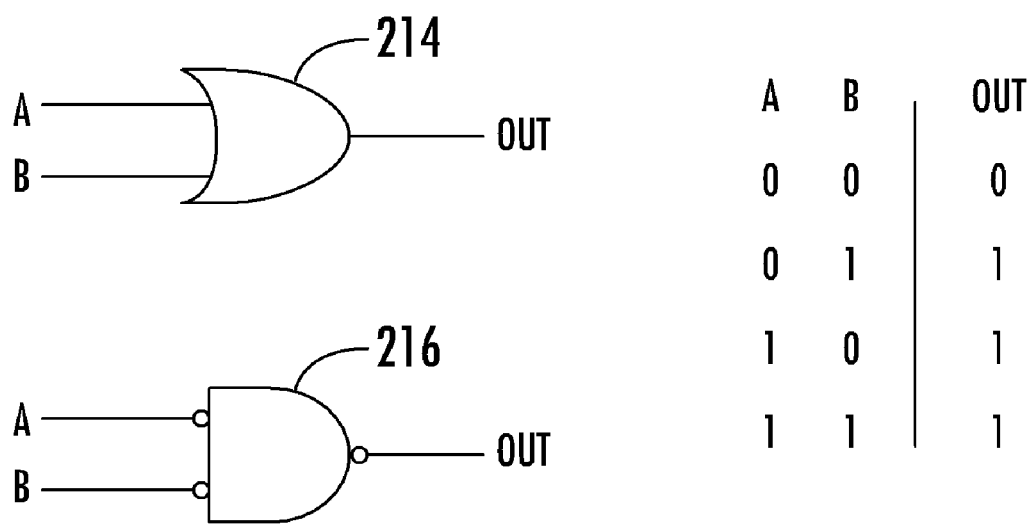
FIG. 2B illustrates two equivalent OR gates in symbolic form, together with their truth table.

FIG. 2A illustrates de Morgan's logic laws as applied to an AND gate and an OR gate with de Morganized inputs and outputs. In FIG. 2A, a logic AND gate 210 includes first and second input ports A and B, and also includes an output port. Also, a logic OR gate 212 with inverting inputs and output (illustrated by the circles adjacent the ports) includes input ports A and B, and an output port. Pursuant to de Morgan's law, these gates exhibit the same states, namely an output state of 0 in response to 00, 01, and 10 inputs, and an output state of 1 in response to an input state of 11. FIG. 2B illustrates de Morgan's logic laws as applied to an OR gate with and without de Morganized inputs and outputs. In FIG. 2B, a logic OR gate 214 includes first and second input ports A and B, and also includes an output port. Also, a logic AND gate 216 with inverting inputs and output (illustrated by the circles adjacent the ports) includes input ports A and B, and an output port. Pursuant to de Morgan's law, the gates of FIG. 2B exhibit the same states, namely an output state of 0 in response to 00 input state, and an output state of 1 in response to input states of 01, 10, and 11.

The negative-logic command pulse applied to port 15 of the power supply 10 of FIG. 1 is coupled to the A input terminals or ports of de Morganized AND gate 216 and OR gate 212. Gate 216 is referred to as an OR gate herein, and gate 212 is referred to as an AND gate. As mentioned, a logic high level of the power enable signal represents an OFF command, and a logic low level represents an ON command. Prior to time t0 of FIGS. 3A, 3B, 3C, 3D, and 3E, the power enable command signal is logic HIGH, as illustrated by plot 310 of FIG. 3A, representing disabling of power application to the load. The power enable command 310 is applied to the A input port of OR gate 216 and to the A input port of AND gate 212. OR gate 216 couples the logic HIGH to its output port, as illustrated by plot 316 of FIG. 3D, and through a noninverting gate driver 22, and from output port 22$o$ of driver 22 and by way of a path 24 to the gate electrode 16$g$ of FET 16. Path 24 may include a current-limiting resistor, if desired. The HIGH level applied to the gate 16$g$ provides no drive for enabling FET 16, so FET 16 remains in the OFF state, as indicated by plot 318 of FIG. 3E at time to. The OFF state of FET 16 provides no drive to load 12. The logic HIGH state at the output 220 of gate driver 22 is coupled by way of scaling resistors defining a voltage dividing feedback path 25 to the B input port of AND gate 212; the voltage division is for the purpose of matching the input port voltage range to the output voltages. In the OFF state of FET 16, no current flows through the channel of FET 16 to load 12, so the load remains de-energized. Also prior to time to, the logic HIGH level of the power enable command signal is applied to the A input port of AND gate 212. Since AND gate 212 already has a logic HIGH level applied to its B input port, AND gate 212 couples a logic HIGH level to noninverting gate driver 26. The logic HIGH level applied to noninverting gate driver 26 flows from its output port 26o by way of a path 28 to the gate 18g of FET 18. Path 28 may include a resistor. The logic HIGH level applied through path 28 maintains FET 18 in a conductive state to discharge any possible charge on the load 12, as indicated by waveform 314 of FIG. 3C prior to time to.

FIG. 3A illustrates the application beginning at a time t2 of the logic LOW power enable signal 310. The logic LOW power enable signal 310, which is applied to AND gate 212, causes a transition to a logic LOW state at time t2 at the output port of AND gate 212, as illustrated by plot 312 of FIG. 3B. This transition to a logic low state is coupled through gate driver 26 and is applied from output port 26o to the gate 18g of FET 18, as illustrated by plot 314 of FIG. 3C. This transition at time t4 tends to turn FET 18 OFF, and the FET is turned OFF just after time t5, as indicated by the logic LOW state of plot 314 of FIG. 3C.

The transition of the power enable signal 310 at time t2 of FIG. 3A is applied to the A input port, but is not immediately coupled through OR gate 216. The transition does not flow through OR gate 216 until the transition reaches the B input port by virtue of the change of state of AND gate 212, which occurs at time t8, as illustrated by plot 316 of FIG. 3D. After time t8, the output of OR gate 216 is logic LOW. The logic LOW state at the output of OR gate 216 following time t8 is coupled to the gate 16g of FET 16 by way of gate driver 22 and path 24, and turns ON FET 16 by a time t12, as illustrated by plot 318 of FIG. 3E. The ON state of FET 16 allows the flow of current to the load 12 from bus 14+. Note that FET 16 cannot turn ON until FET 18 has been turned OFF.

At some later time, the power enable signal will once again call for deenergization of the load. This is illustrated at time t20 of FIG. 3A by the transition from a logic LOW state to a logic HIGH state. The transition to a logic HIGH state is coupled through OR gate 216, gate driver 22, and path 24 to the gate 16g of FET 16. This HIGH state turns FET 16 OFF at times after time t24, as illustrated by plot 318 of FIG. 3E, so that current is no longer sourced to the load 12. The logic HIGH state at the output of OR gate 216 and driver 22 initiated by the transition of the power enable signal at time t20 is coupled back to the B input port of AND gate 212, which makes a transition to a logic HIGH output state near a time t26, as suggested by plot 312 of FIG. 3B. The logic HIGH output state of AND gate 212 is coupled to the B input port of OR gate 216, and is also applied to the gate 18g of FET 18, thereby turning ON FET 18 near time t28, as illustrated by plot 314 of FIG. 3C.

As mentioned, with a logic HIGH (logic 1) applied to port 15 of power supply 10 prior to time t2, a logic HIGH level appears at the output port 220 of gate driver 22. This logic HIGH is applied by way of a feedback path designated generally as 25 to the B input port of AND gate 212. With a logic HIGH applied to both of its input ports, AND gate 212 responds with a logic HIGH (logic 1) at its output port, as suggested by plot 312 of FIG. 3B at time t26. The logic HIGH appearing at the output port of AND gate 212 is applied to a gate driver 26, and a logic HIGH appears at its output port 26o. The logic HIGH level appearing at output port 26o of gate driver 26 is applied by way of a path 28 to the gate 18g of FET 18. The logic HIGH level provides drive which tends to turn ON FET 18, which tends to maintain the load 12 deenergized. The logic HIGH level appearing at the output port 26o of gate driver 26 is also applied by way of scaling resistors defining a voltage dividing feedback path designated generally as 30 to the B input port of OR gate 216. The logic HIGH applied to an input port of OR gate 216 has no effect in the presence of a logic HIGH at input port A prior to time t26, and OR gate 216 continues to produce a logic HIGH level at its output port at time t30.

When it is desired to apply a power pulse to the load 12 of FIG. 1, the power enable command makes a transition to a logic LOW (logic 0) level, as suggested by the transition of plot 310 of FIG. 3A at time t2. This results in a transition to a logic LOW level at the A input port of AND gate 212, with the result that the AND gate 212 transitions at a later time t4 toward a logic LOW output state, as illustrated by plot 312 of FIG. 3B. The output of AND gate 212 reaches a logic LOW output state at a time illustrated as t5 in FIG. 3C. The logic LOW level at the output of AND gate 212 after time t4 is coupled through gate driver 26 and appears at its output port 26o, and is applied to the gate 18g of FET 18. The logic LOW level applied to gate 18g renders FET 18 nonconductive or OFF near a time t6, as illustrated by plot 314 of FIG. 3C.

As so far described, the application of a logic low power enable signal at a time t2, following a logic high power-off condition, begins with a transition of the state of AND gate 212, which renders FET 18 nonconductive. As mentioned, when it is desired to apply a power pulse to the load 12 of FIG. 1, the power enable command makes a transition to a logic LOW (logic 0) level, as suggested by the transition of plot 310 of FIG. 3A at time t2. This transition to a logic LOW level is applied to the A input port of OR gate 216. A logic LOW level is also applied to the B input port of OR gate 216 from the output of gate driver 26 by way of feedback network 30. The net result is to apply logic LOW levels to both the A and B input ports of OR gate 216. Thus, logic LOW levels are applied to both the A and B input ports of OR gate 216, which results in a logic LOW level at the output port of OR gate 216. The transition of the output port of OR gate 216 to a logic LOW level is illustrated by plot 316 of FIG. 3D at time t8. The transition from a logic HIGH level to a logic LOW level at the output of OR gate 216 at time t8 is propagated through gate driver 22 and path 24 to the gate 16g of FET 18 at a time t12, and is also applied by way of feedback path 25 to the B input port of AND gate 212. The logic. LOW level applied to gate 16g beginning at time t12 provides drive to enable FET 16 for conduction. Conduction of FET 16 provides power to the load 12. As mentioned, the load may be a drain of a MMIC. A salient feature of the operation as so far described is that FET 16 is enabled only after FET 18 is disabled, so that FET 18 is never in an ON state simultaneously with FET 16.

The state of the power supply 10 remains in a state with FET 16 ON and FET 18 OFF for so long as the power enable signal remains at a logic LOW level. The duration of an ON pulse in one embodiment is about one microsecond (μS), with a duty cycle of 50%. In FIGS. 3A through 3E the enabled state of the load occurs in the interval t12 to t24, in response to the power enable signal application in the interval t2 to t20.

Turn-OFF of the power supply 10 from the ON state begins with a transition from logic LOW to logic HIGH of the power enable signal near a time t20, as illustrated by plot 310 of FIG. 3A. The logic HIGH state immediately propagates through OR gate 216 and the gate driver 22 to the gate 16g of FET 16 at time t22, thereby disabling FET 16. With FET 16 disabled at time t24, the flow of power to the load 12 ceases. The logic HIGH state applied to the gate 16g of FET 16 is also fed back to the B input port of AND gate 212, causing the output of AND gate 212 to make a transition to a logic HIGH level, as illustrated by plot 312 of FIG. 3C at time t26. The transition of the output of AND gate 212 to a logic HIGH level at time t26 is propagated by path 28 to the gate 18g of FET 18 at a time t28, thereby rendering FET 18 conductive to discharge any residual charge then appearing on the load 12. After time t28, the state of the power supply 10 will remain the same as it was prior to time t2. The next operation of power supply 10 occurs when another power enable pulse is applied.

It should be noted that, since the gate drivers 22 and 26 of FIG. 1 are noninverting, they may be considered to be part of their drive circuits. Thus, gate driver 22 may be considered to be part of OR gate 216, and gate driver 26 may be considered to be part of AND gate 212.

It should be noted that the terms "between," "across," and other terms such as "parallel" have meanings in an electrical context which differ from their meanings in the field of mechanics or in ordinary parlance. More particularly, the term "between" in the context of signal or electrical flow relating to two separate devices, apparatuses or entities does not relate to physical location, but instead refers to the identities of the source and destination of the flow. Thus, flow of signal "between" A and B refers to source and destination, and the flow itself may be by way of a path which is nowhere physically located between the locations of A and B. The term "between" can also define the end points of the electrical field extending "across" or to points of differing voltage or potential, and the electrical conductors making the connection need not necessarily lie physically between the terminals of the source. Similarly, the term "parallel" in an electrical context can mean, for digital signals, the simultaneous generation on separate signal or conductive paths of plural individual signals, which taken together constitute the entire signal. For the case of current, the term "parallel" means that the flow of a current is divided to flow in a plurality of separated conductors, all of which are physically connected together at disparate, spatially separated locations, so that the current travels from one such location to the other by plural paths, which need not be physically parallel.

In addition, discussions of circuits necessarily describe one element at a time, as language is understood in serial time. Consequently, a description of two interconnected elements may describe them as being in "series" or in "parallel," which will be true for the two elements described. However, further description of the circuit may implicate other interconnected devices, which when connected to the first two devices may result in current flows which contradict the "series" or "parallel" description of the original two devices. This is an unfortunate result of the limitations of language, and all descriptions herein should be understood in that context.

Also, the term "coupled" as used herein includes electrical activity extending from one element to another element either by way of an intermediary element or in the absence of any intermediary element or, put another way, the term "coupled" as used herein contemplates connection which either includes or excludes intermediary elements.

A gating circuit (10) according to an aspect of the disclosure is for responding to active low pulse, signals (310) which command a pulse to occur, and for driving a highline P-channel FET (16) and a lowline N-channel FET (18). The gating circuit (10) comprises a two-element FET gate driver (22, 26) in which one element (22) drives the highline P-channel FET (16) and the other element (26) drives the low line N-channel FET (18), and in which an output (22o, 26o) of each element (22, 26) connects to a pair of scaling resistors (25, 30) which provide inputs to two logic gates (216, 212), which logic gates also receive the active low pulse signals. The gating circuit (10) further comprises inputs to the gate driver (22, 26) from outputs of the logic gates (216, 212).

A gating circuit (10) is for driving a load (12), and comprises a power bus (14) connected to the load (12) for maintaining a direct voltage. A first load driver (16) is connected to the power bus (14) and to the load (12). A second load driver (18) is connected to the power bus (14) and to the load (12). The gating circuit (10) also includes a first logic gate (216, 22) capable of receiving a power enable signal. The first logic gate (216, 22) is connected to the first load driver (16). The gating circuit (10) also includes a second logic gate (212, 26) capable of receiving the power enable signal. The second logic gate (212, 26) is connected to the second load driver (18). A first feedback path (25) extends from an output of the first logic gate (216, 22) to an input of the second logic gate (212, 26). A second feedback path extends from an output of the second logic gate to an input of the first logic gate. In a particular embodiment, the load (12) may include first (12+) and second (12−) terminals, the power bus (14) may include first (14+) and second (14−) conductors across which the direct voltage is maintained, and a connection may be provided between the second terminal (12−) of the load (12) and the second conductor (14−) of the power bus (14). In a further embodiment, the first load driver (16) includes source, gate, and drain electrodes, the source electrode (16s) of the first load driver (16) is connected to the first power bus conductor (14+), and the drain electrode (16d) of the first load driver (16) is connected by a first output path (19) to the first terminal of the load. In a further embodiment of the gating circuit (10), the second load driver (18) includes source, gate, and drain electrodes, with the source (18s) electrode of the second load driver (18) being connected to the second power conductor (14−) and the drain electrode (18d) of the second load driver (18) being coupled by a second output path (19,20) to the first terminal (12+) of the load (12). In a further embodiment, the first logic gate (216) may comprise an OR gate including first (A) and second (B) input terminals and an output terminal. The first input terminal (A) of the OR gate is connected to receive the power enable signal (310) and the output terminal of the OR gate (216) is coupled by a first intermediate path (22, 24) to the gate (16g) of the first load driver (16). The second logic gate (212) may comprise an AND gate (212) including first (A) and second (B) input terminals and an output terminal. The first input terminal (A) of the AND gate (212) is connected to receive the power enable signal (310), and the output terminal of the AND gate (212) is coupled by a second intermediate path (26,28) to the gate (18g) of the second load driver (18). The first feedback path (25) extends from the output, terminal of the OR gate (216) to the second input terminal (B) of the AND gate (212), and the second feedback path (30) extends from the output terminal of the AND gate (212) to the second input terminal (B) of the OR gate (216).

A gating circuit (10) according to an aspect of the disclosure is for driving a load (12), which load (12) includes first (12+) and second (12−) terminals. The load may comprise a drain of a monolithic microwave integrated circuit. The gating circuit (10) comprises a power bus (14) including first (14+) and second (14−) conductors across which direct voltage (11) is maintained, and a connection between the second terminal (12−) of the load (12) and the second conductor (14−) of the power bus. A first load driver (16) includes source (16s), gate (16g) and drain (16d) electrodes. The first load driver may comprise a p-channel enhancement-mode FET. The source electrode (16s) of the first load driver (16) is connected to the first power bus conductor (14+), and the drain electrode (16d) of the first load driver (16) is connected by a first output path (19) to the first terminal (12+) of the load (12). The gating circuit (10) includes a second load driver (18) including source (18s), gate (18g); and drain (18d) electrodes. The second load driver (18) may comprise an N-channel enhancement-mode FET. The source electrode (18s) of the second load driver (18) is connected to the second power conductor (14−) and the drain electrode (18*d*) is coupled by a second output path (19, 20) to the first terminal (12+) of the load (12). A source (15*s*) of power enable signal takes on a first logic state (high) when the load (12) is to be disabled and a second logic state (low) when the load (12) is to be enabled. An OR gate (216, 22) is provided, which OR gate (216) includes first (A) and second (B) input terminals and an output terminal (216*o*, 22*o*). The first input terminal (A) of the OR gate (216) is connected to receive the power enable signal, and the output terminal (216*o*, 22*o*) of the OR gate (216) is coupled by a first intermediate path (22, 24) to the gate (16*g*) of the first load driver (16). An AND gate (212, 26) includes first (A) and second (B) input terminals and an output terminal (212*o*, 26*o*). The first input terminal (A) of the AND gate (212) is connected to receive the power enable signal, and the output terminal (212*o*, 26*o*) of the AND gate (212) is coupled by a second intermediate path (28) to the gate (18*g*) of the second load driver (18). A first feedback path (25) extends from the output terminal (216*o*, 22*o*) of the OR gate (216, 22) to the second input terminal (B) of the AND gate (212, 26). A second feedback path (30) extends from the output terminal (212*o*, 26*o*) of the AND gate (212, 26) to the second input terminal (B) of the OR gate (216, 22). The first intermediate path (24) andor the second intermediate path (28) may include a current limiting resistor. The first (25) and second (30) feedback paths may include a voltage divider. The gating circuit may comprise a capacitor ($C_{out}$) connected between the first (14+) and second (14−) conductors of the power bus. The second output path (19, 20) may comprise a resistor.

In particular embodiments of the gating circuit, first intermediate path (24) includes a high-speed gate drive circuit (22), and in another embodiment, the first path (24) includes a current limiting resistor. In yet a further embodiment, the second intermediate path (28) includes a high-speed gate drive circuit (26), a current limiting resistor, or both. In an embodiment in which the input signal levels of the gates are different from the output signal levels, each of the first (25) and second (30) feedback paths includes a voltage divider. In a particularly advantageous embodiment, the gating circuit further comprises a capacitor ($C_{out}$) connected between the first (14+) and second (14−) conductors of the power bus. In one version of the gating circuit, the first load driver (16) comprises a p-channel enhancement-mode FET and the second load driver comprises an N-channel enhancement-mode FET.

What is claimed is:

1. A gating circuit for driving a load, said gating circuit comprising;
   a power bus for maintaining a direct voltage, said power bus connected to said load;
   a first load driver connected to said power bus and said load;
   a second load driver connected to said power bus and said load;
   a first logic gate capable of receiving a power enable signal, said first logic gate connected to said first load driver;
   a second logic gate capable of receiving said power enable signal, said second logic gate connected to said second load driver;
   a first feedback path extending from an output of said first logic gate to an input of said second logic gate and having a voltage divider between the output of said first logic gate and the input of said second logic gate; and
   a second feedback path extending from an output of said second logic gate to an input of said first logic gate and having a voltage divider between the output of said second logic gate and the input of said first logic gate.

2. A gating circuit according to claim 1, wherein:
   said load includes first and second terminals;
   said power bus includes first and second conductors across which said direct voltage is maintained, and further including;
   a connection between said second terminal of said load and said second conductor of said power bus.

3. A gating circuit according to claim 1, wherein said first load driver includes source, gate, and drain electrodes, said source electrode of said first load driver being connected to said first power bus conductor, and said drain electrode of said first load driver being connected by a first output path to said first terminal of said load.

4. A gating circuit according to claim 3, wherein said second load driver includes source, gate, and drain electrodes, said source electrode of said second load driver being connected to said second power conductor and said drain electrode of said second load driver being coupled by a second output path to said first terminal of said load.

5. A gating circuit according to claim 4, wherein said first logic gate comprises an OR gate including first and second input terminals and an output terminal, said first input terminal of said OR gate being connected to receive said power enable signal and said output terminal of said OR gate being coupled by a first intermediate path to said gate of said first load driver.

6. A gating circuit according to claim 5, wherein said second logic gate comprises an AND gate including first and second input terminals and an output terminal, said first input terminal of said AND gate being connected to receive said power enable signal, and said output terminal of said AND gate being coupled by a second intermediate path to said gate of said second load driver.

7. A gating circuit according to claim 6, wherein said first feedback path extends from said output terminal of said OR gate to said second input terminal of said AND gate; and
   said second feedback path extends from said output terminal of said AND gate to said second input terminal of said OR gate.

8. The gating circuit of claim 1, wherein said first feedback path and the second feedback path are independent of the power circuit voltage.

9. A gating circuit for driving a load, which load includes first and second terminals, said gating circuit comprising;
   a power bus including first and second conductors across which direct voltage is maintained;
   a connection between said second terminal of said load and said second conductor of said power bus;
   a first load driver including source, gate, and drain electrodes, said source electrode of said first load driver being connected to said first power bus conductor, and said drain electrode of said first load driver being connected by a first output path to said first terminal of said load;
   a second load driver including source, gate, and drain electrodes, said source electrode of said second load driver being connected to said second power conductor and said drain electrode being coupled by a second output path to said first terminal of said load;
   a source of power enable signal which takes on a first logic state when said load is to be disabled and a second logic state when said load is to be enabled;
   an OR gate including first and second input terminals and an output terminal, said first input terminal of said OR gate being connected to receive said power enable signal and said output terminal of said OR gate being coupled by a first intermediate path to said gate of said first load driver;

an AND gate including first and second input terminals and an output terminal, said first input terminal of said AND gate being connected to receive said power enable signal, and said output terminal of said AND gate being coupled by a second intermediate path to said gate of said second load driver;

a first feedback path extending from said output terminal of said OR gate to said second input terminal of said AND gate, said first feedback path including a voltage divider; and a second feedback path extending from said output terminal of said AND gate to said second input terminal of said OR gate, said second feedback path including a voltage divider.

10. A gating circuit according to claim 9, wherein said first intermediate path includes a high-speed gate drive circuit.

11. A gating circuit according to claim 10, wherein said first intermediate path includes a current limiting resistor.

12. A gating circuit according to claim 9, wherein said second intermediate path includes a high-speed gate drive circuit.

13. A gating circuit according to claim 12, wherein said second intermediate path includes a current limiting resistor.

14. A gating circuit according to claim 9, wherein the voltage divider of the first feedback path comprises a first resistor between the output terminal of the OR gate and the second input terminal of the AND gate, and a second resistor between the second input terminal of the AND gate and the second conductor of the power bus.

15. A gating circuit according to claim 9 further comprising a capacitor connected between said first and second conductors of said power bus.

16. A gating circuit according to claim 9, wherein said load comprises a drain of a monolithic microwave integrated circuit.

17. A gating circuit according to claim 9, wherein said first load driver comprises a p-channel enhancement-mode FET.

18. A gating circuit according to claim 9, wherein said second load driver comprises an N-channel enhancement-mode FET.

19. A gating circuit according to claim 9, wherein said second output path comprises a resistor.

20. A gating circuit according to claim 9, wherein said first logic state is a logic HIGH state and said second logic state is a logic LOW state.

21. A gating circuit according to claim 20, wherein said logic HIGH state has a positive value relative to said logic LOW state.

22. A gating circuit for responding to active low pulse signals which command a pulse to occur, and for driving a highline P-channel FET and a lowline N-channel FET said gating circuit comprising a two-element FET gate driver in which one element drives said highline P-channel FET and the other element drives said low line N-channel FET, and in which an output of each element connects to a pair of scaling resistors which provide inputs to two logic gates, which logic gates also receive said active low pulse signals, and further comprising inputs to said gate driver from outputs of the logic gates.

* * * * *